(12) United States Patent
Honda et al.

(10) Patent No.: US 8,054,240 B2
(45) Date of Patent: Nov. 8, 2011

(54) ELECTRONIC APPARATUS

(75) Inventors: Tomoko Honda, Kanagawa-ken (JP); Nobuyoshi Kuroiwa, Kanagawa-ken (JP); Masaomi Nakahata, Kanagawa-ken (JP); Jun Morimoto, Kanagawa-ken (JP); Satoru Honda, Kanagawa-ken (JP); Yoshikazu Hata, Kanagawa-ken (JP); Koichi Sato, Tokyo (JP); Akihiro Tsujimura, Tokyo (JP); Makoto Tabata, Tokyo (JP); Minoru Sakurai, Tokyo (JP); Shoji Kato, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 571 days.

(21) Appl. No.: 11/902,448

(22) Filed: Sep. 21, 2007

(65) Prior Publication Data

US 2008/0150811 A1   Jun. 26, 2008

(30) Foreign Application Priority Data

Dec. 20, 2006   (JP) .................................. 2006-343486

(51) Int. Cl.
*H01Q 1/24* (2006.01)
*H01Q 1/40* (2006.01)

(52) U.S. Cl. .......................... 343/906; 343/702; 343/873

(58) Field of Classification Search .................. 343/702, 343/906, 872, 873; 455/575.1, 575.3, 575.4, 455/575.7, 90.3
See application file for complete search history.

(56) References Cited

U.S. PATENT DOCUMENTS

| | | | |
|---|---|---|---|
| 6,326,925 B1 * | 12/2001 | Perkio et al. | 343/702 |
| 7,498,990 B2 * | 3/2009 | Park et al. | 343/702 |
| 7,570,218 B2 * | 8/2009 | Tsujimura et al. | 343/702 |
| 2006/0114159 A1 * | 6/2006 | Yoshikawa et al. | 343/702 |
| 2006/0170597 A1 * | 8/2006 | Kurashima et al. | 343/700 MS |
| 2006/0270472 A1 * | 11/2006 | Chen et al. | 455/575.7 |
| 2008/0252536 A1 * | 10/2008 | Anguera et al. | 343/702 |

FOREIGN PATENT DOCUMENTS

| | | |
|---|---|---|
| CN | 1866616 A | 11/2006 |
| JP | 64-40910 | 3/1989 |
| JP | 9-8535 | 1/1997 |
| JP | 9-246832 | 9/1997 |
| JP | 10-32409 | 2/1998 |
| JP | 2000-315905 | 11/2000 |
| JP | 2003-110453 | 4/2003 |

OTHER PUBLICATIONS

Notification of Reason(s) for Refusal issued by the Japanese Patent Office on Jan. 25, 2011, for Japanese Patent Application No. 2006-343486, and English-language translation thereof (total 14 pages).

(Continued)

*Primary Examiner* — Jacob Y Choi
*Assistant Examiner* — Robert Karacsony
(74) *Attorney, Agent, or Firm* — Finnegan, Henderson, Farabow, Garrett & Dunner, L.L.P.

(57) ABSTRACT

An electronic apparatus includes: a housing provided with a first conductive pattern; a substrate provided with a first wiring layer in a surface thereof and fixed to the housing; and a first conductive member connecting the first conductive pattern and the first wiring layer. The first conductive pattern extends onto an outer surface and an inner surface of the housing. The first conductive member is in contact with each of at least a part of the first conductive pattern extending onto the inner surface and an end of the first wiring layer. Alternatively, an electronic apparatus includes: a housing provided with a conductive pattern and having a through part in a frame portion thereof; and a substrate provided with a wiring layer on a surface thereof and having a protruding part and fixed to the housing. The protruding part and the through part are fit. The conductive pattern extends onto an outer surface of the housing and onto an inner surface of the through part. At least some of the conductive pattern extending onto the inner surface is in contact with an end of the wiring layer.

20 Claims, 11 Drawing Sheets

OTHER PUBLICATIONS

Notification of the First Office Action issued by the Chinese Patent Office on Oct. 13, 2010, for Chinese Patent Application No. 200710159914.2, and English-language translation thereof (total 14 pages).

* cited by examiner

ELECTRONIC APPARATUS

CROSS-REFERENCE TO RELATED APPLICATIONS

This application is based upon and claims the benefit of priority from the prior Japanese Patent Application No. 2006-343486, filed on Dec. 20, 2006; the entire contents of which are incorporated herein by reference.

BACKGROUND OF THE INVENTION

1. Field of the Invention

This invention relates to an electronic apparatus.

2. Background Art

In an electronic apparatus such as a cellular phone or PDA (Personal Digital Assistant), for suppressing affection of noise between an antenna and circuit components, it is preferable that they are disposed so that the distance thereof becomes long as much as possible. For example, there is a structure in which an antenna by in-mold or MID (Molded Interconnection Device) is separated from the substrate and disposed between the substrate provided with the circuit components and the housing and in which the power supply between the antenna and the substrate is performed through a plate spring or a spring connector or the like.

However, for disposing a plate spring or a spring connector, a space is required. As downsizing, thinning, and weight saving of the electronic apparatus are more required and substrate package density is higher, it becomes difficult to ensure such a space. In particular, in an electronic apparatus having a plurality of antennas for corresponding to a multi-band, it is important to reduce the space connecting the antenna and the substrate.

There is a disclosed example of an technique with respect to a portable wireless device in which a non-power supply element disposed in an upper housing is connected to a lower housing with a wire and by which a high antenna performance is exerted in the phone call and thinning of the housing can be achieved in no phone call (Japanese Unexamined Patent Publication JP-A 2003-110453 (Kokai)).

SUMMARY OF THE INVENTION

According to an aspect of the invention, there is provided an electronic apparatus including: a housing provided with a first conductive pattern; a substrate provided with a first wiring layer in a surface thereof and fixed to the housing; and a first conductive member connecting the first conductive pattern and the first wiring layer, the first conductive pattern extending onto an outer surface and an inner surface of the housing, and the first conductive member being in contact with each of at least a part of the first conductive pattern extending onto the inner surface and an end of the first wiring layer.

According to another aspect of the invention, there is provided an electronic apparatus including: a housing provided with a conductive pattern and having a through part in a frame portion thereof; and a substrate provided with a wiring layer on a surface thereof and having a protruding part and fixed to the housing, the protruding part and the through part being fit, the conductive pattern extending onto an outer surface of the housing and onto an inner surface of the through part, and at least some of the conductive pattern extending onto the inner surface being in contact with an end of the wiring layer.

According to another aspect of the invention, there is provided an electronic apparatus including: a housing provided with a conductive pattern and having a through part; a substrate provided with a wiring layer on a surface thereof and fixed to the housing; and a conductive member connecting the conductive pattern and the wiring layer, the conductive pattern extending onto an outer surface of the housing and onto an inner surface of the through part, and the conductive member being in contact with at least a part of the conductive pattern on the inner surface of the through part.

DETAILED DESCRIPTION OF THE INVENTION

Hereinafter, embodiments of this invention will be explained with reference to drawings.

Figure 1A:
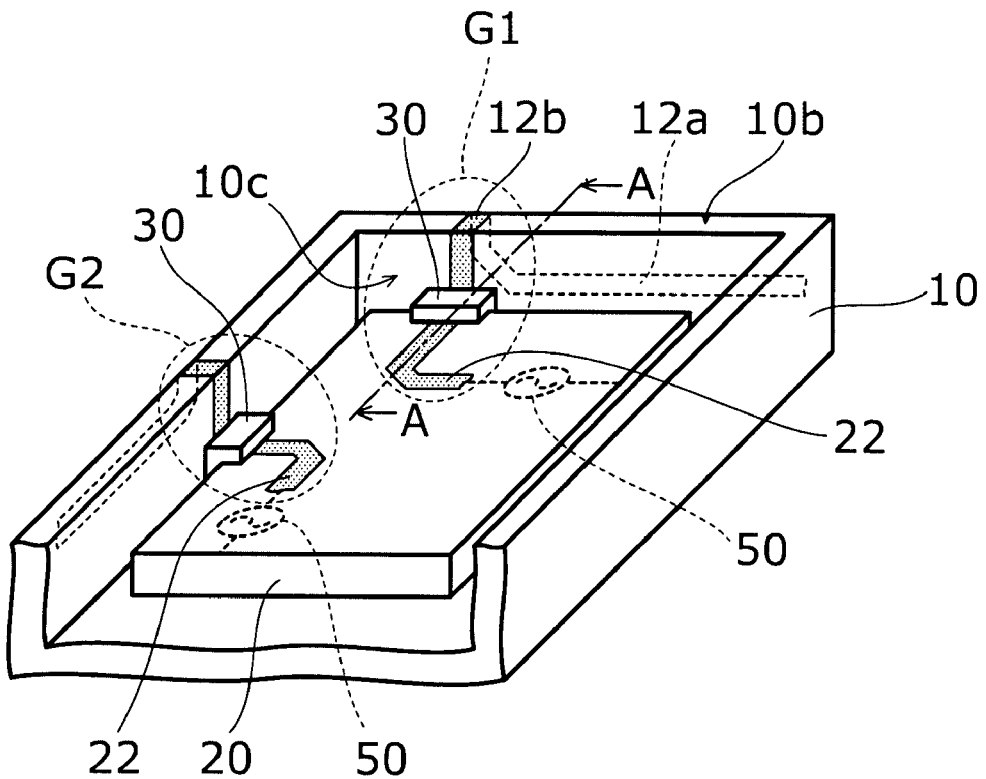
FIGS. 1A and 1B show an electronic apparatus according to the first embodiment of this invention.
Figure 1B:
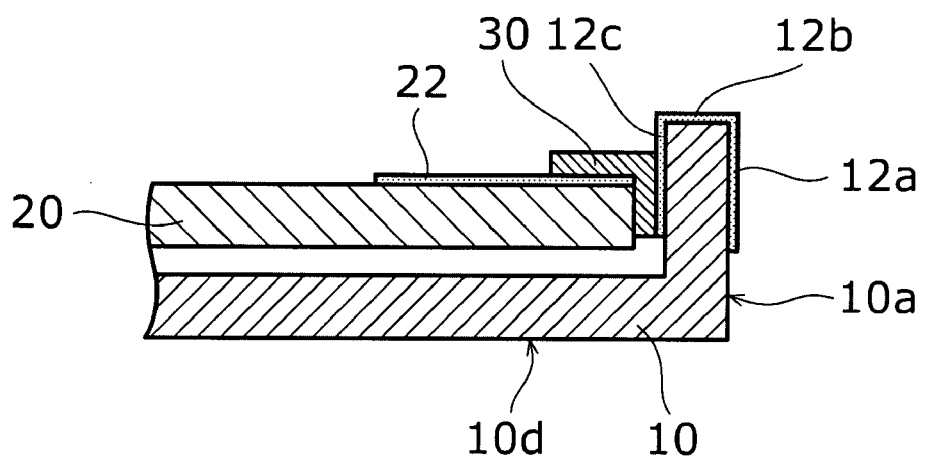

FIGS. 1A and 1B show an electronic apparatus according to the first embodiment of this invention. FIG. 1A is a schematic perspective view, and FIG. 1B is a schematic section view along the chain line A-A. A housing 10 may be any one of an operating portion including a keyboard and a display portion including a liquid crystal image. A surface of the housing 10 having a frame portion is composed of an outer surface and an inner surface.

Out of them, the outer surface includes a frame outer surface portion 10a and a bottom surface portion 10d, and the inner surface includes a frame upper surface portion 10b and a frame inner surface portion 10c. An antenna pattern 12 includes 12a provided on the frame outer surface portion 10a, 12b provided on the frame upper surface portion 10b, and 12c provided on the inner surface portion 10c.

When the antenna pattern 12a is made to extend onto the frame outer surface portion 10a of the housing 10, the distance from circuit components (not shown) on a substrate 20 can be long and thereby affection of noise can be reduced. It can be thought to dispose the antenna pattern on an inner surface of the housing 10, but a lib or a boss is occasionally provided on an inner surface of the housing 10, and the shape of the antenna pattern 12 is restricted.

As a material of the housing 10, for example, a resin can be used. In this case, the antenna pattern 12 can be formed by printing, sheet-metal attachment, in-molding, sheet-molding, sheet-adhesion, or insert-molding.

On the other hand, on the substrate 20 made of a glass epoxy material or the like, circuit components (not shown) are disposed and connected to a power source, a control circuit, a signal-processing circuit, a power supply part 50, a display portion, a keyboard, the antenna pattern 12, and so forth through a wiring layer 22.

In dashed portion G1 of FIG. 1A, the wiring layer 22 on the substrate 20 is connected to the antenna pattern 12c through a conductive member 30 composed of a conductive elastic body made of a conductive rubber or the like. The conductive rubber has rich elasticity and therefore enables favorable electric connection by pressure, and when adhesive or the like is used, the connection can be more certain.

In the structure in which the antenna composed of in-mold or MID is disposed between the housing and the substrate and the connection is performed through a plate spring or a spring connector, a space for disposing them is required. By contrast, in this embodiment, the spaces for the plate spring and the spring connector and the space for disposing antenna are not required, and downsizing and thinning of the housing are possible.

Moreover, in FIG. 1A, as well as the dash line G1, in the dash line G2, the wiring layer 22 is connected to the inner surface portion 12c of the antenna pattern 12 through the conductive member 30. That is, in one communication zone, it becomes easy to separate antenna patterns of, for example, sending and receiving. Furthermore, it becomes easy to provide antenna patterns for a plurality of communication zones corresponding to a multiband system. That is, one of the antenna patterns can be used for a first frequency band, and other of the antenna patterns can be used for a second frequency band which is different from the first frequency band.

As a result, the sending and receiving function can be extended including wireless LAN, FM and AM broadcast, GPS (Global Positioning System), and one-segment broadcast of receiving terrestrial digital broadcasting, as well as cellular-phone triple band such as GSM (Global System for Mobile Communication), and DCS (Digital Cellular System)/PCS (Personal Communications Service). Furthermore, an electronic apparatus being capable of downsizing and thinning with maintaining stable electrical connection is provided.

As described above, when the antenna pattern 12 pluralizes, downsizing and thinning of the housing becomes easy by this embodiment in which the connection structure with the power supply part 50 on the substrate 20 is simple.

Here, explanation about the antenna pattern 12 is complemented.

Figure 2A:
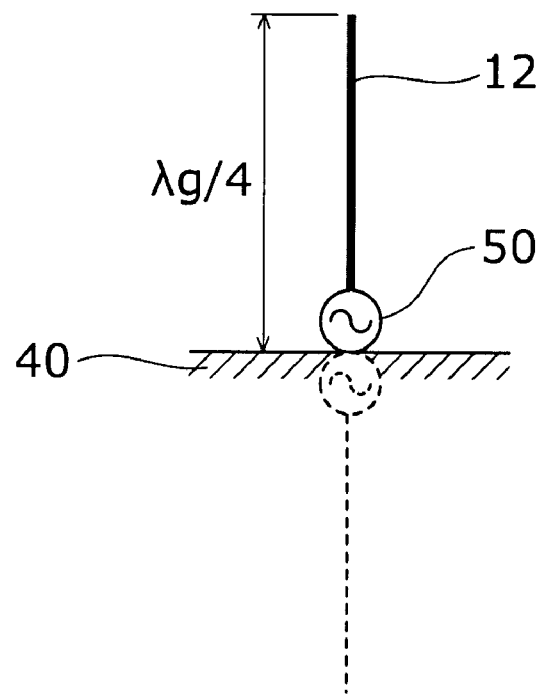
FIGS. 2A and 2B are schematic views showing the antenna pattern 12.
Figure 2B:
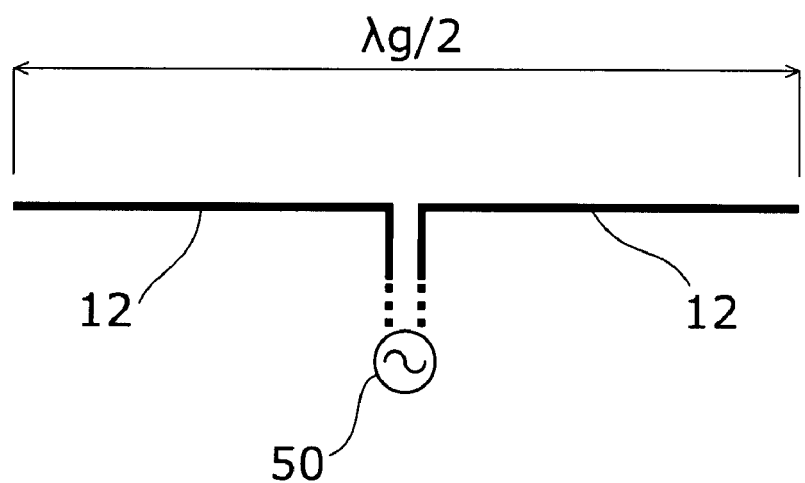

FIGS. 2A and 2B are schematic views showing the antenna pattern 12. FIG. 2A shows the case of a monopole antenna, and FIG. 2B shows the case of a dipole antenna. The length of the antenna pattern 12 of a monopole antenna is an approximately quarter wavelength. The power supply part 50 is connected to one end of the monopole antenna and to a ground 40 and excites the antenna.

The ground 40 is, for example, provided on a back surface of the substrate 20 and acts as a half-wavelength antenna by an image represented by dash line in FIG. 2A. Because permittivity of a material composing the housing 10 is more than 1, the wavelength is shorter than that of free space and the antenna pattern 12 can be downsized.

FIG. 2B shows a dipole antenna. The length of the antenna is an approximately half wavelength. Each of the two of the antenna divided at the midpoint of the antenna pattern 12 is connected to the power supply part 50 and the antenna is excited. The power supply part 50 is provided on the substrate and connected to the antenna pattern 12 with the wiring layer.

As the antenna, an inverted-F antenna can also be used. The antenna pattern 12a can be folded on the outer surface portion 10a of the housing 10, alternatively, the antenna pattern 12a can be a zigzag shape, a meander shape, a loop shape, or the like on a flat outer surface of the housing 10. Furthermore, a folded monopole antenna and a folded dipole antenna are possible.

Figure 3A:
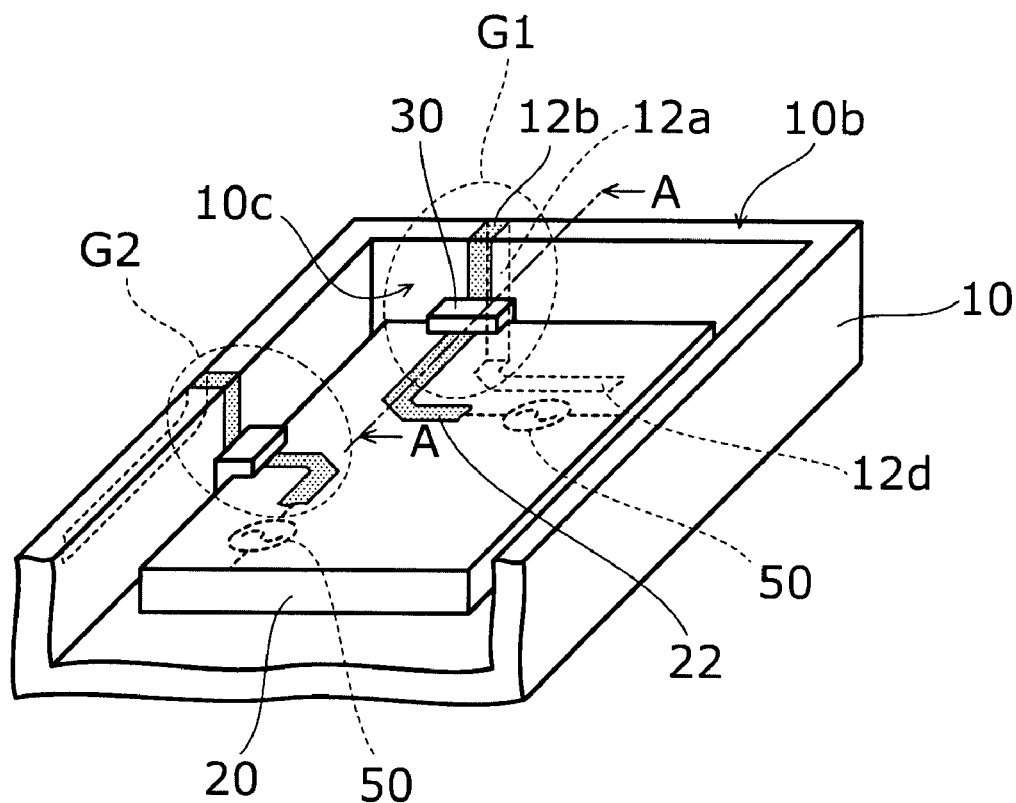
FIGS. 3A and 3B are schematic views showing a modified example of a first embodiment.
Figure 3B:
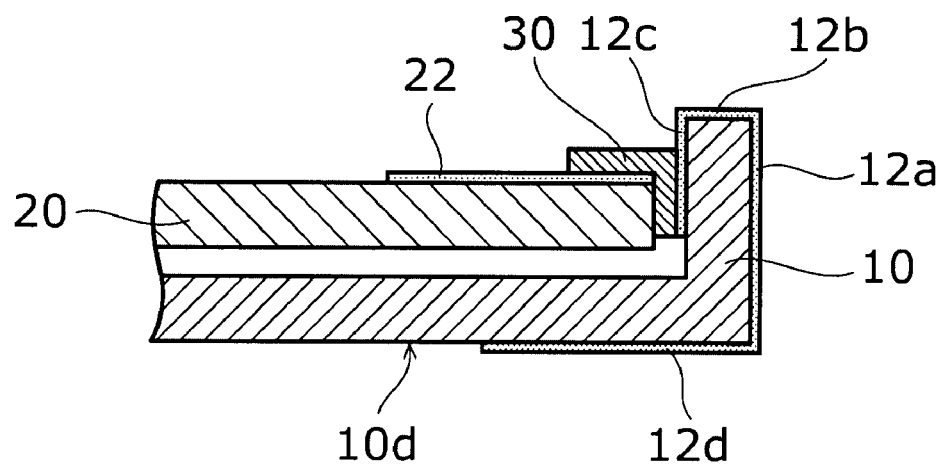

FIGS. 3A and 3B are schematic views showing a modified example of a first embodiment. The same components as FIGS. 1A and 1B are appended with the same number and specific explanation thereof will be omitted. The antenna pattern 12 includes 12d provided on a bottom 10d of the housing 10. In the case of the housing of a folding-type electronic apparatus having a hinge part, when the antenna pattern 12d is provided outside, dispositions of a display device, a keyboard, and so forth become easy but are not limited to this structure.

The conductive member 30 and the antenna pattern 12 generate noise by electromagnetic irradiation (EMI) and occasionally affect other circuit components. Moreover, noise from other circuit components occasionally affects the antenna characteristics. Therefore, it is preferable that the distance between the antenna pattern 12 and the circuit components is longer, and also, electromagnetic shield of the circuit components is effective.

Figure 4A:
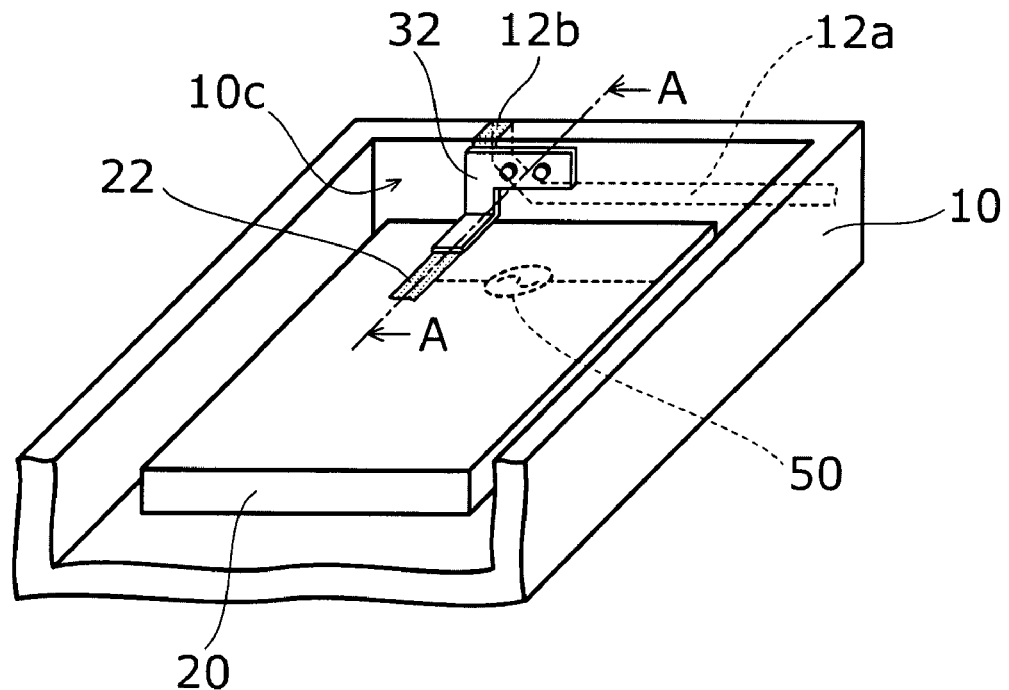
FIGS. 4A and 4B show an electronic apparatus according to the second embodiment of this invention.
Figure 4B:
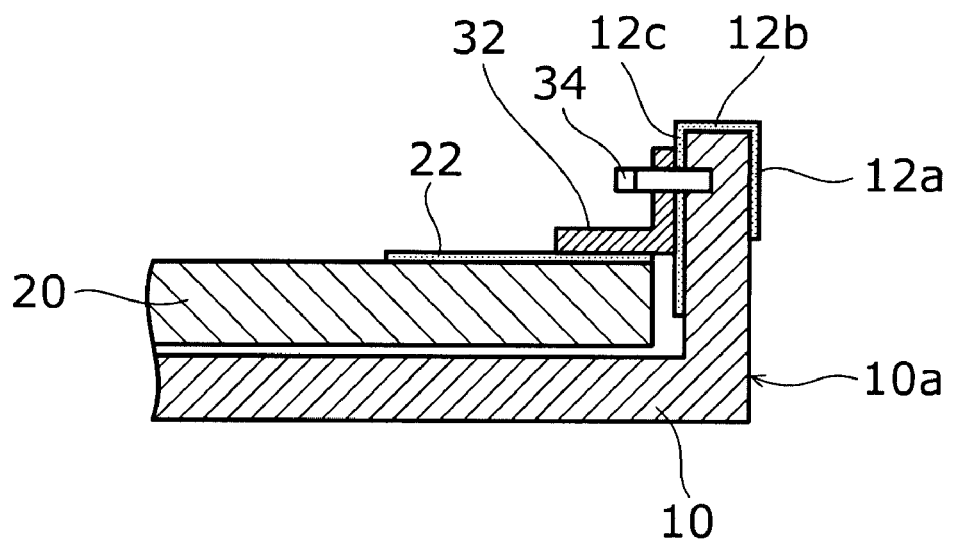

FIGS. 4A and 4B show an electronic apparatus according to the second embodiment of this invention. FIG. 4A is a schematic perspective view, and FIG. 4B is a schematic section view along the chain line AA. The same components as FIGS. 1A and 1B are appended with the same number and specific explanation thereof will be omitted. The wiring layer 22 on the substrate 20 is connected to the antenna pattern 12c through a conductive member 32 composed of a sheet metal or the like. The conductive member 32 of a sheet metal is fixed to the housing 10 with a screw 34 or the like. Adhesion is also possible without using a screw. Also, welding is possible without using a screw, similarly. As an example of the welding, there is a method of providing a protruding part in the housing, fitting the protruding part into the conductive member having a protruding portion, and heating to melt down the protruding part and thereby to perform the fixation.

In this case, the conductive member 32 contacts the wiring layer 22 and the antenna pattern 12c by pressure, and thereby, favorable electric connection can be obtained. Also in this embodiment, the spaces for the plate spring and the spring connector and the space for disposing antenna are not required, and downsizing and thinning of the housing 10 are possible.

In the first and second embodiments, as the conductive member 30 or 32, a member made of a conductive rubber, a sheet metal, or the like has been used. However, as the conductive member 30 or 32, a conductive layer on the side surface of the substrate 20 can also be used.

Figure 5A:
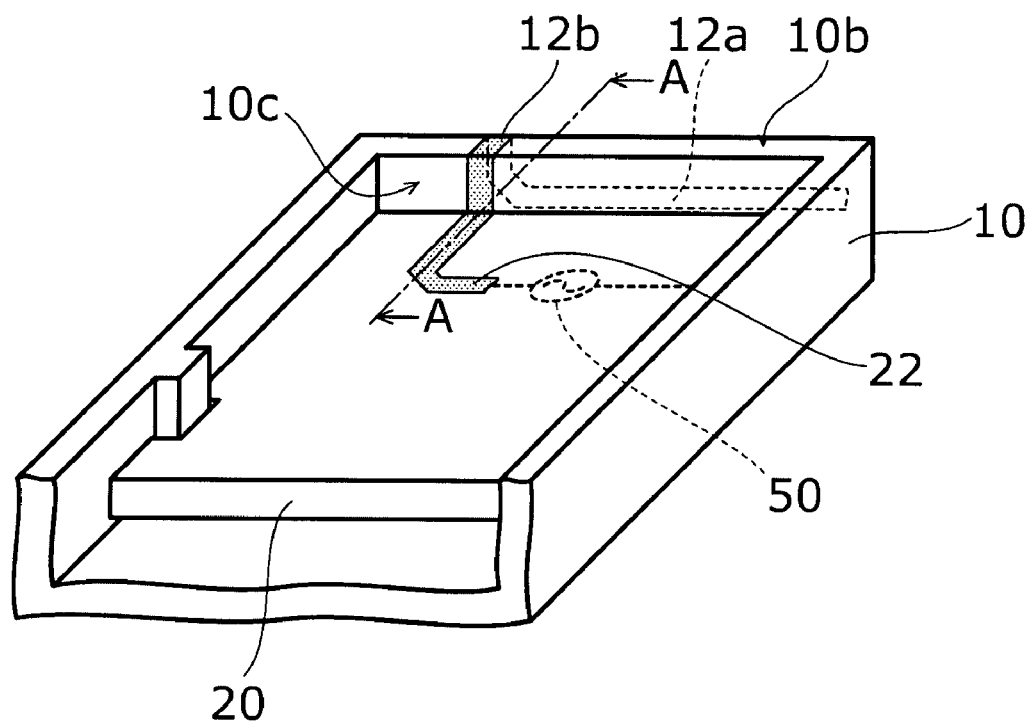
FIGS. 5A and 5B show an electronic apparatus according to the third embodiment of this invention.
Figure 5B:
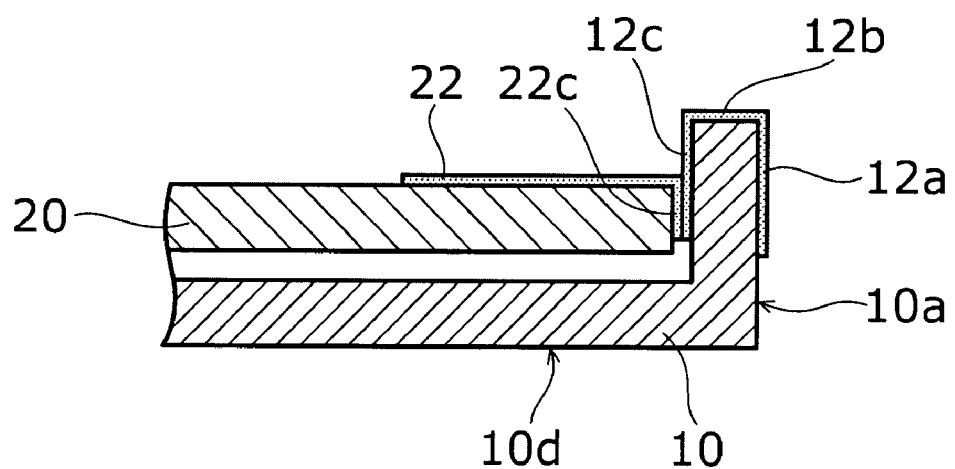

FIGS. 5A and 5B show an electronic apparatus according to the third embodiment of this invention. FIG. 5A is a schematic perspective view, and FIG. 5B is a schematic section view along the chain line AA.

A conductive layer 22c is a portion of the wiring layer 22 formed on a surface of the substrate 20 which extends onto the side surface of the substrate 20. The substrate 20 is pressed to the inner surface portion 10c of the housing 10, and the conductive layer 22c and the antenna pattern 12c are contacted, and thereby, favorable electric contact is formed. The structure is simple, but downsizing and thinning of the housing 10 are possible with maintaining the antenna performance.

As described above, electrical connection between the antenna pattern 12 and the wiring layer 22 on the substrate 20 has been explained. Next, a method of fixation between the substrate 20 and the housing 10 will be explained. For fixing the substrate 20 to the housing 10, screw cramp, adhesion, welding, or the like is used. Furthermore, a method of providing a protruding portion by cutout in the substrate and fitting a protruding part provided in the housing 10 into the protruding portion can be used.

Figure 6:
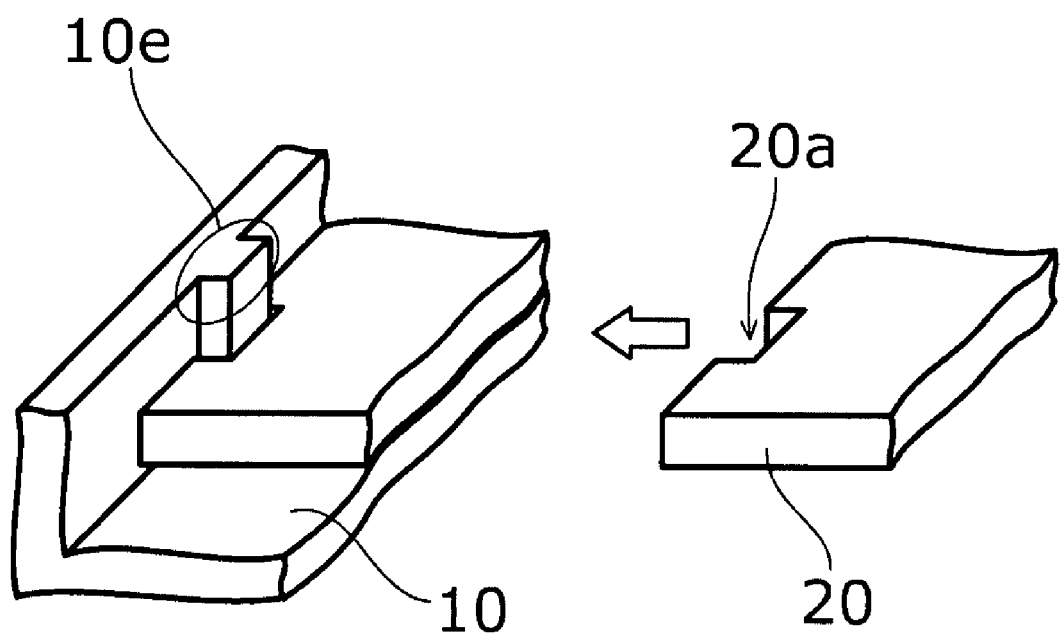
FIG. 6 is a schematic perspective view showing a structure in which the substrate 20 is fixed using a protruding part of the housing 10.

FIG. 6 is a schematic perspective view showing a structure in which the substrate 20 is fixed using a protruding part of the housing 10. The housing 10 is provided with a protruding part 10e, and a protruding portion 20a is provided on the substrate 20 by cutout. By fitting the protruding part 10e and the protruding portion 20a, the positioning becomes easy. The substrate 20 can be certainly fixed to the housing 10 with maintaining the antenna performance as described above.

Next, the structure in which a protruding part formed on the substrate 20 is fit into a protruding portion provided on the housing 10 to connect the antenna pattern 12 and the substrate 20 will be explained.

Figure 7A:
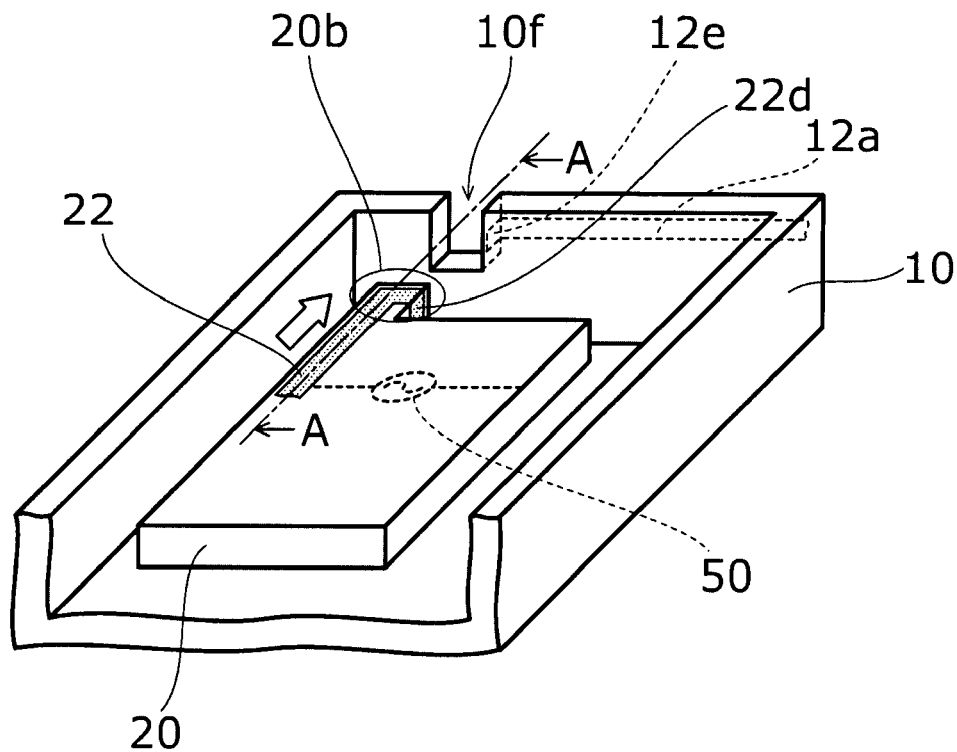
FIGS. 7A and 7B show an electronic apparatus according to the fourth embodiment of this invention.
Figure 7B:
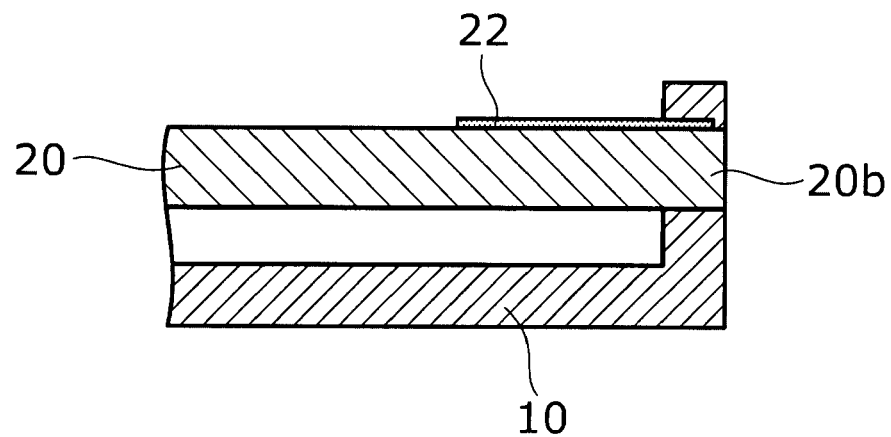

FIGS. 7A and 7B show an electronic apparatus according to the fourth embodiment of this invention. FIG. 7A is a schematic perspective view, and FIG. 7B is a schematic section view along the chain line AA. A protruding part 20b formed on the substrate 20 is fit into a cutout-like through part 10f provided on a frame portion of the housing 10, and thus the substrate 20 is fixed.

The surface of the housing 10 is composed of an outer surface and an inner surface. Out of them, the outer surface includes a frame outer surface portion 10a and a bottom surface portion 10d, and the inner surface includes a frame upper surface portion 10b, a frame inner surface portion 10c, an inner surface portion of the through part 10f. An antenna pattern 12 includes 12a provided on the frame outer surface portion 10a, 12b provided on the frame upper surface portion 10b, 12c provided on the inner surface portion 10c, and 12e provided on the inner surfaces of the cave portion 10f.

On the other hand, on the side surface of the protruding part 20b of the substrate 20 in contact with the inner surface of the through part 10f of the housing 10, a conductive layer 22d onto which the wiring layer 22 extends is formed. An antenna pattern 12e and the conductive layer 22d of the substrate 20 are electrically connected.

As shown in FIG. 7B, the outer top face of the protruding portion 20b forms a substantially continuous flat and smooth surface with the outer surface of the housing 10 when the protruding portion 20b is fit into the through part 10f.

The antenna pattern 12, the wiring layer 22, and the conductive layer 22d can be formed by printing, but the conductive layer 22d and the inner surface portion 12e that are folded at 90° may be formed by using a conductive tape or the like. This structure also enables downsizing and thinning of the housing with maintaining the antenna performance.

Figure 8A:
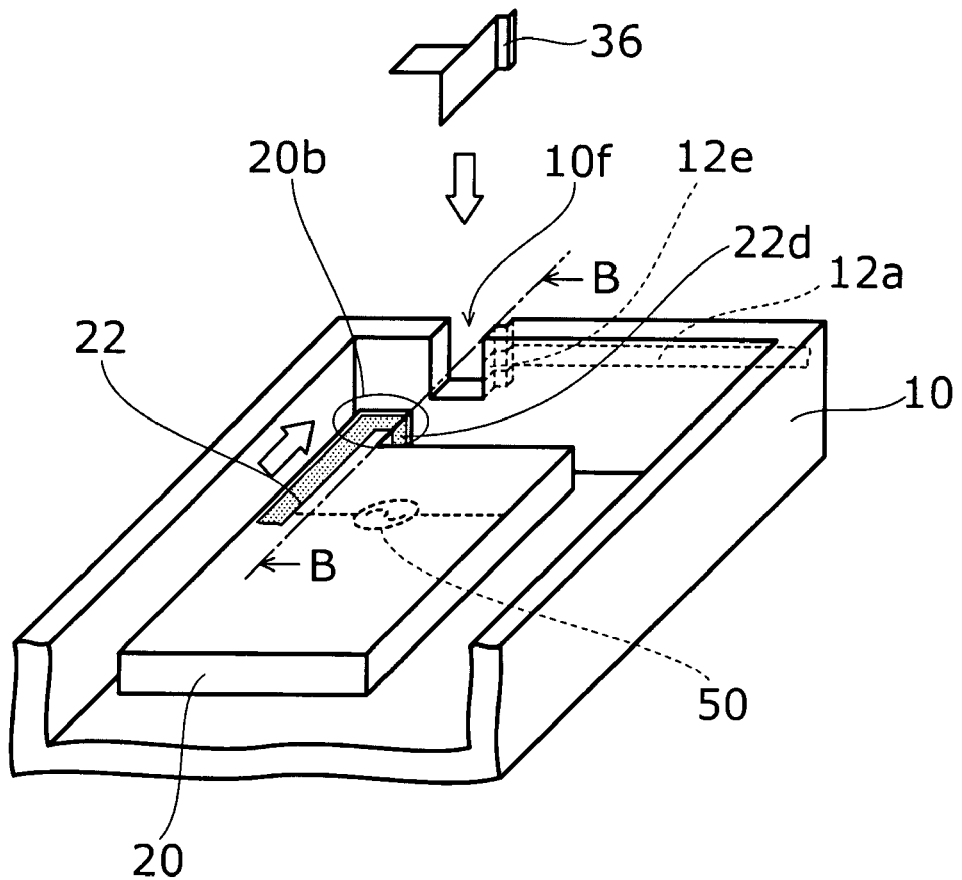
FIGS. 8A and 8B show first modified example of the fourth embodiment.
Figure 8B:
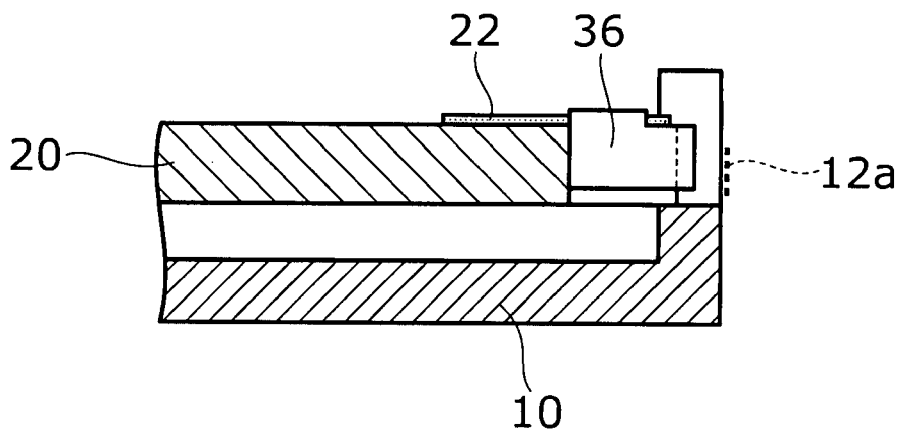

FIGS. 8A and 8B show first modified example of the fourth embodiment. FIG. 8A is a schematic perspective view, and FIG. 8B is a schematic section view along the chain line B-B. In this modified example, a step is formed on an outer surface of the housing 10 adjacent to the cutout-like through part 10f provided on the frame portion of the housing 10. Moreover, a conductive member 36 such as a metal that is folded along the protruding part 20b of the substrate 20 and that extends along the inner surface side 12e of the through part 10f and that is further folded along the step is sandwiched between the substrate 20 and the housing 10. The conductive member 36 connects the wiring layer 22 and the inner surface portion 12e and supplies the power to the antenna pattern 12. The substrate 20 can be fixed so that the protruding part 20b of the substrate 20 does not fall out of the outer surface of the frame portion of the housing 10. According to this modified example, even when the position of the antenna pattern 12 is modified, the connection can be easily performed by changing the shape of the conductive member 36.

Figure 9A:
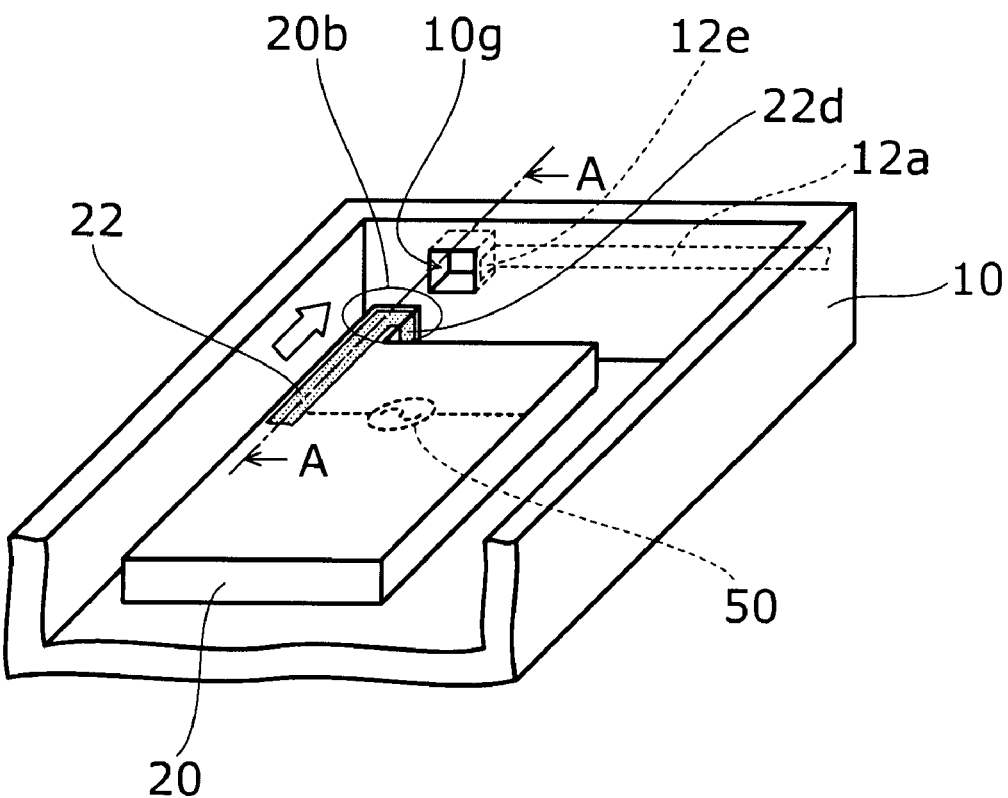
FIGS. 9A and 9B show a second modified example of the fourth embodiment.
Figure 9B:
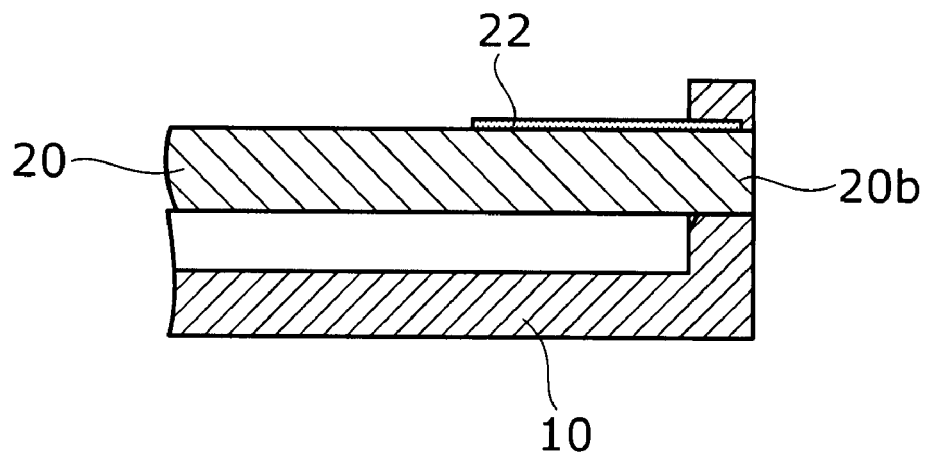

FIGS. 9A and 9B show a second modified example of the fourth embodiment. FIG. 9A is a schematic perspective view, and FIG. 9B is a schematic section view along the chain line A-A. The same components as FIGS. 7A and 7B are appended with the same number and specific explanation thereof will be omitted. In this modified example, a through part 10g is an opening passing through the frame portion of the housing 10. When the protruding part 20b can be fit into the through part 10g with high accuracy, the fixation of the substrate 20 becomes easy, and downsizing and thinning thereof become easy.

Figure 10A:
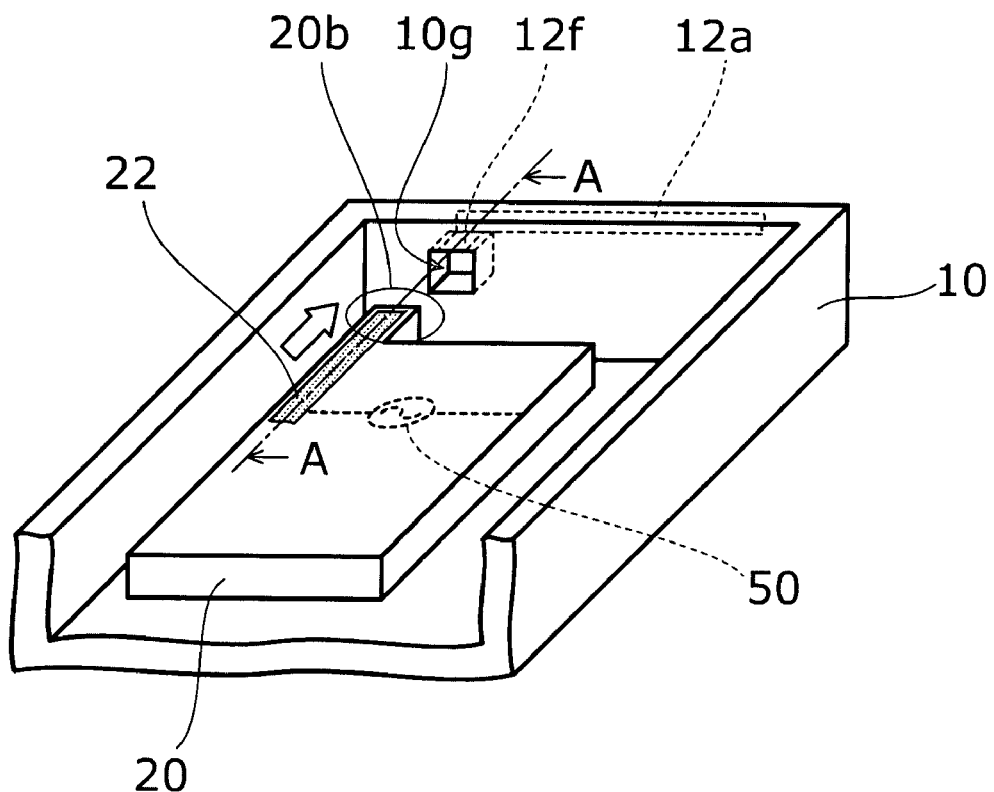
FIGS. 10A and 10B show a third modified example of the fourth embodiment.
Figure 10B:
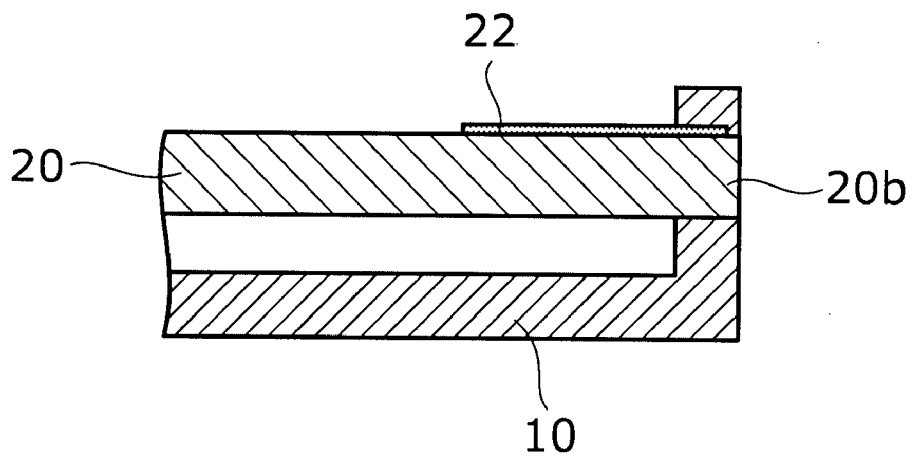

FIGS. 10A and 10B show a third modified example of the fourth embodiment. FIG. 10A is a schematic perspective view, and FIG. 10B is a schematic section view along the chain line A-A. On the protruding part 20b of the substrate 20, the wiring layer 22 extends on the same plane. An antenna pattern 12f extends onto the inner side surface of the upper side of the opening-like through part 10g and is in contact with the wiring layer 22. Also, in this case, when the protruding part 20b can be fit into the through part 10g with high accuracy, the fixation of the substrate 20 becomes easy, and downsizing and thinning thereof become easy.

Figure 11A:
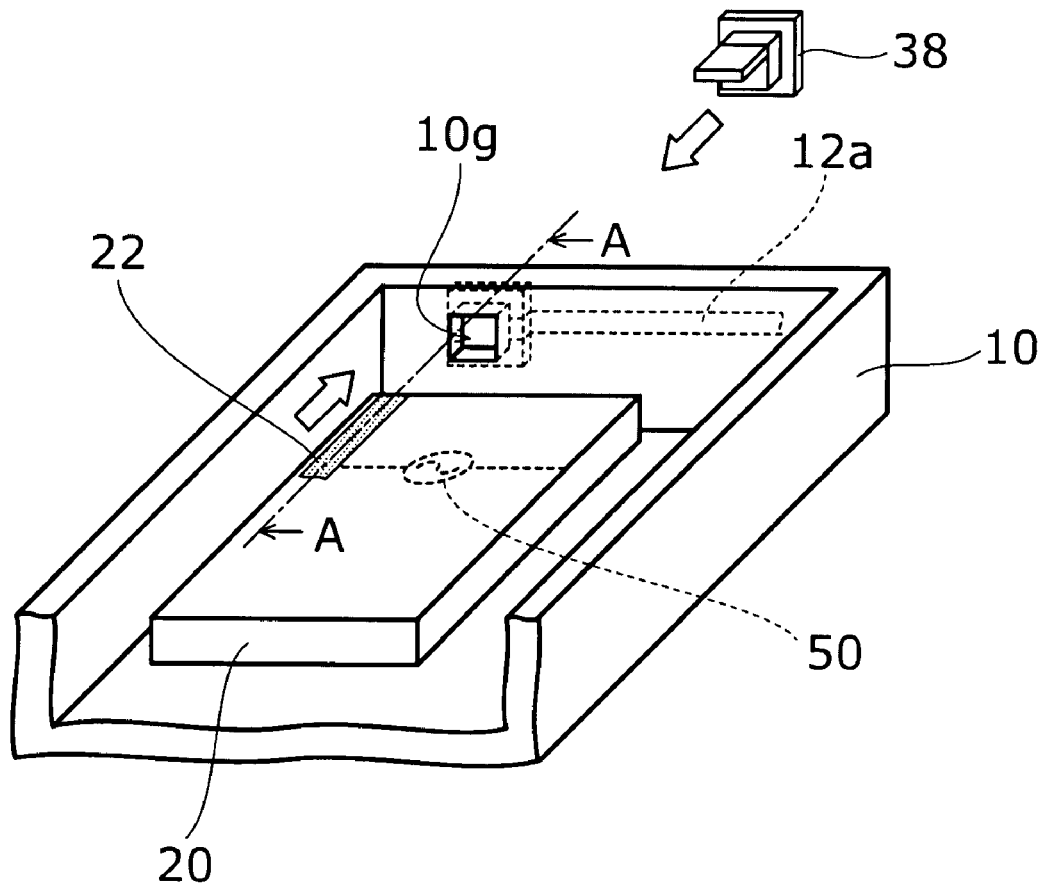
FIGS. 11A and 11B show a fourth modified example of the fourth embodiment.
Figure 11B:
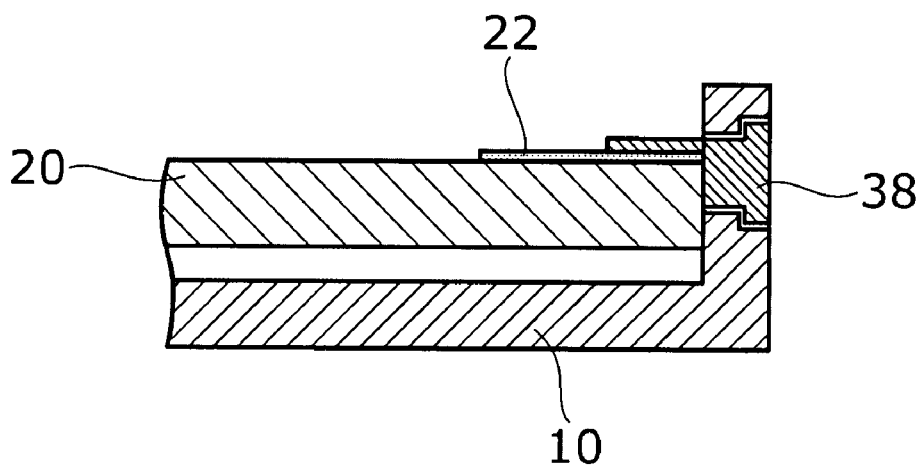

FIGS. 11A and 11B show a fourth modified example of the fourth embodiment. FIG. 11A is a schematic perspective view, and FIG. 11B is a schematic section view along the chain line A-A. In the case of this modified example, the opening-like through part 10g has a structure of two stages, a conductive member 38 made of such as a metal or a conductive elastic material is fit into the through part 10g. The wiring layer 22 is connected to a projection-shaped end of the conductive member 38, and the antenna pattern 12 is connected to the conductive member 38 in the inner wall of the through part 10g having the two-stage structure. In this modified example, even when the shape of the antenna pattern 12 is changed, the connection to the conductive member 38 can be easily performed. Moreover, because the through part 10g has the two-stage structure, positioning of the conductive member 38 with respect to the housing 10 is possible.

In the above-described embodiment examples and the modified examples associated therewith, the case in which the antenna pattern 12 is provided on a surface of the housing 10 has been explained. However, this invention is not limited thereto. The case in which a conductive pattern for connecting an electronic component such as an illuminance sensor and a semiconductor light-emitting element is provided is included in this invention.

As described above, the embodiments of this invention have been explained with reference to drawings. However, this invention is not limited to these embodiments. Various design changes by those skilled in the art with respect to the antenna pattern, the conductive member, the substrate, the housing, and so forth, which compose this invention, are also included in the scope of this invention as long as not departing from the purport of this invention.

The invention claimed is:
1. An electronic apparatus comprising:
   a housing provided with a first conductive pattern;
   a substrate provided with a first wiring layer in a surface thereof and fixed within the housing, the first wiring layer extending to a side surface of the substrate; and a first conductive member electrically connecting the first conductive pattern and the first wiring layer, wherein the housing has a bottom surface portion and a frame portion provided on a periphery of the bottom surface portion, the first conductive pattern extends along an outside surface of the frame portion continuously to an inside surface of the frame portion, the outside surface being opposite to the inside surface, the first conductive member is interposed between a part of the first conductive pattern extending on the inside surface and the side surface of the substrate, the side surface of the substrate being opposite to the part of the first conductive pattern, and the first conductive member is provided in contact with the part of the first conductive pattern and an edge of the first wiring layer.

2. The electronic apparatus according to claim 1, wherein the first conductive member is one of a conductive elastic body, a sheet metal, and a conductive layer provided on the side surface of the substrate.

3. The electronic apparatus according to claim 1, wherein the substrate is fixed to the housing by at least one of screw scamp, adhesion, welding, and fit.

4. The electronic apparatus according to claim 1, wherein the first conductive pattern is an antenna pattern.

5. The electronic apparatus according to claim 1, wherein the first conductive member is fixed to the housing.

6. The electronic apparatus according to claim 1, further comprising:
a second conductive pattern provided on the housing;
a second wiring layer provided on the substrate;
a second conductive member connecting the second conductive pattern and the second wiring layer, wherein
the second conductive pattern extends onto an outer surface and an inner surface of the housing, and
the second conductive member is in contact with each of at least a part of the second conductive pattern extending onto the inner surface and an end of the second wiring layer.

7. The electronic apparatus according to claim 6, wherein the first conductive patterns is a first antenna pattern for a first frequency band, and
the second conductive patterns is a second antenna pattern for a second frequency band, the second frequency band being different from the first frequency band.

8. The electronic apparatus according to claim 1, wherein the first conductive member is placed in a gap between the part of the first conductive pattern and the side surface of the substrate.

9. The electronic apparatus according to claim 2, wherein
the conductive elastic body is placed in a gap between the part of the first conductive pattern and the side surface of the substrate, and
the conductive elastic body is pressed by the part of the first conductive pattern and the side surface of the substrate.

10. An electronic apparatus comprising:
a housing provided with a conductive pattern and having a through part in a frame portion thereof; and
a substrate provided with a wiring layer on a surface thereof and having a protruding part and fixed to the housing,
the protruding part and the through part being fit,
the conductive pattern extending onto an outer surface of the housing and onto an inner surface of the through part, and
at least some of the conductive pattern extending onto the inner surface being in contact with an end of the wiring layer,
wherein the end of the wiring layer extends onto the protruding part.

11. The electronic apparatus according to claim 10, wherein the through part is a cutout provided in the frame portion.

12. The electronic apparatus according to claim 10, wherein the through part is an opening, the opening passing through the frame portion.

13. The electronic apparatus according to claim 10, wherein the conductive pattern is an antenna pattern.

14. The electronic apparatus according to claim 10, wherein a top surface of the protruding part forms a substantially continuous flat surface with the outer surface of the housing.

15. An electronic apparatus comprising:
a housing provided with a conductive pattern and having a through part;
a substrate provided with a wiring layer on a surface thereof and fixed to the housing; and
a conductive member electrically connecting the conductive pattern and the wiring layer,
the conductive pattern extending onto an outer surface of the housing and onto an inner surface of the through part, and
the conductive member being in contact with at least a part of the conductive pattern on the inner surface of the through part, wherein
the substrate has a protruding part,
the wiring layer extends onto the protruding part,
at least a part of the protruding part is fit into the through part, and
the conductive member interposes between the protruding part and the inner surface of the through part.

16. The electronic apparatus according to claim 15, wherein the through part is a cutout provided in the housing.

17. The electronic apparatus according to claim 15, wherein the through part is an opening, the opening passing through the housing.

18. The electronic apparatus according to claim 15, wherein
the conductive member is fit into the through part, and
a projection-shaped end of the conductive member is in contact with the wiring layer.

19. The electronic apparatus according to claim 18, wherein the through part has a two-stage structure.

20. The electronic apparatus according to claim 15, wherein the conductive pattern is an antenna pattern.

* * * * *

UNITED STATES PATENT AND TRADEMARK OFFICE
CERTIFICATE OF CORRECTION

| | | |
|---|---|---|
| PATENT NO. | : 8,054,240 B2 | Page 1 of 1 |
| APPLICATION NO. | : 11/902448 | |
| DATED | : November 8, 2011 | |
| INVENTOR(S) | : Honda et al. | |

It is certified that error appears in the above-identified patent and that said Letters Patent is hereby corrected as shown below:

Claim 7, column 7, line 42, change "first conductive patterns" to --first conductive pattern--.

Claim 7, column 7, line 44, change "second conductive patterns" to --second conductive pattern--.

Signed and Sealed this
Fourteenth Day of August, 2012

David J. Kappos
*Director of the United States Patent and Trademark Office*